(12) United States Patent
Gomi et al.

(10) Patent No.: US 11,041,892 B2
(45) Date of Patent: Jun. 22, 2021

(54) SEMICONDUCTOR DEVICE, SEMICONDUCTOR SYSTEM, AND CONTROL METHOD OF THE SAME

(71) Applicant: RENESAS ELECTRONICS CORPORATION, Tokyo (JP)

(72) Inventors: Takahiko Gomi, Tokyo (JP); Ryu Nagasawa, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days.

(21) Appl. No.: 16/182,104

(22) Filed: Nov. 6, 2018

(65) Prior Publication Data
US 2019/0195924 A1     Jun. 27, 2019

(30) Foreign Application Priority Data

Dec. 22, 2017   (JP) .............................. JP2017-246307

(51) Int. Cl.
*G06F 1/3206* (2019.01)
*G06F 1/324* (2019.01)
(Continued)

(52) U.S. Cl.
CPC ............... *G01R 21/02* (2013.01); *G01K 7/01* (2013.01); *G05B 11/42* (2013.01); *G06F 1/206* (2013.01);
(Continued)

(58) Field of Classification Search
CPC .......... G10R 21/02; G10R 21/04; G01K 7/01; G01K 7/015; G05B 1/00; G05B 1/01; G05B 1/36; G05B 1/38; G05B 1/42; G06F 1/20; G06F 1/206; G06F 1/32; G06F 1/3203; G06F 1/3206; G06F 1/3209;
(Continued)

(56) References Cited

U.S. PATENT DOCUMENTS

| | | | |
|---|---|---|---|
| 9,141,421 | B2 * | 9/2015 | Eisen ........................ G06F 1/26 |
| 9,261,935 | B2 | 2/2016 | Branover et al. |
| 2015/0268997 | A1 | 9/2015 | Svilan et al. |
| 2016/0378149 | A1 | 12/2016 | Kam et al. |
| 2017/0285700 | A1 | 10/2017 | Cartagena et al. |

FOREIGN PATENT DOCUMENTS

| | | |
|---|---|---|
| EP | 2808757 A2 | 12/2014 |
| JP | 2014-186418 A | 10/2014 |

OTHER PUBLICATIONS

Xin Wang, "Intelligent Power Allocation, Maximize performance in the thermal envelope", White Paper, Arm, Mar. 2017.
(Continued)

*Primary Examiner* — Diana J. Cheng
(74) *Attorney, Agent, or Firm* — McDermott Will & Emery LLP

(57) ABSTRACT

A semiconductor device is provided which can suppress heating while assigning performances to a plurality of modules whose heat generations are controlled while considering usage conditions of the plurality of modules. The semiconductor device includes a load detection unit that detects operation rates of the plurality of modules, a weighting calculation unit that calculates coefficients of the plurality of modules based on the operation rates of the plurality of modules, and a heat generation control unit that controls power consumptions of the plurality of modules based on the coefficients of the plurality of modules.

10 Claims, 6 Drawing Sheets

(51) Int. Cl.
   *G06F 1/20* (2006.01)
   *G01R 21/02* (2006.01)
   *G06F 9/50* (2006.01)
   *G01K 7/01* (2006.01)
   *G05B 11/42* (2006.01)

(52) U.S. Cl.
   CPC ............ *G06F 1/324* (2013.01); *G06F 1/3206* (2013.01); *G06F 9/5094* (2013.01)

(58) Field of Classification Search
   CPC .... G06F 1/3212; G06F 1/3215; G06F 1/3218; G06F 1/3221; G06F 1/3225; G06F 1/3228; G06F 1/3231; G06F 1/3234; G06F 1/3237; G06F 1/324; G06F 9/5094
   See application file for complete search history.

(56) References Cited

OTHER PUBLICATIONS

Extended European Search Report issued in corresponding European Patent Application No. 18210969.4-1221, dated May 9, 2019.
V. Gupta et al., "Core Groups: System Abstractions for Extending the Dynamic Range of Client Devices Using Heterogeneous Cores", Sustainable Computing: Informatics and Systems, vol. 3, No. 3, Sep. 1, 2013, pp. 194-206.
Europeam Office Action issued in corresponding European Patent Application No. 18210969.4-1203, dated Jul. 27, 2020.

* cited by examiner

SEMICONDUCTOR DEVICE, SEMICONDUCTOR SYSTEM, AND CONTROL METHOD OF THE SAME

CROSS-REFERENCE TO RELATED APPLICATIONS

The disclosure of Japanese Patent Application No. 2017-246307 filed on Dec. 22, 2017 including the specification, drawings and abstract is incorporated herein by reference in its entirety.

BACKGROUND

The present invention relates to a semiconductor device, a semiconductor system, and a control method thereof. For example, the present invention relates to a semiconductor device, a semiconductor system, and a control method thereof, which, for example, perform heat generation control.

In recent years, in a semiconductor integrated circuit device, to meet market needs such as increasing capacity, improving performance, reducing cost, and improving user experiences, rapid acceleration of semiconductor process and upsizing of SoC (System on Chip) including a plurality of high-performance/high-power hardware modules are performed. Because of such upsizing of SoC, the importance of countermeasures against heat generation is increasing.

Japanese Unexamined Patent Application Publication No. 2014-186418 (Patent Document 1) discloses a technique which includes a plurality of different types of devices to be managed and a management device that manages power supplied to the plurality of devices to be managed and the management device supplies a predetermined total power amount to the devices to be managed so that the total amount of performances of the devices to be managed becomes maximum. By using the technique disclosed in Japanese Unexamined Patent Application Publication No. 2014-186418, it is possible to reduce power consumption while suppressing degradation of entire performance to minimum.

Xin Wang, "Intelligent Power Allocation, Maximize performance in the thermal envelope", WHITE PAPER, ARM (Non-Patent Document 1) discloses a technique where an IPA (Intelligent Power Allocation) acquires temperature information from an optionally set THS (Thermal Sensor) and performs heat generation control by obtaining available power consumption for a plurality of modules (modules A/B) that are controlled by the IPA and adjusting a clock. Specifically, in the technique disclosed in Non-Patent Document 1, power consumption that can be used by PID control in order to cause saturation at a preset target temperature is calculated based on the temperature information acquired from the THS, and the power consumption that can be used is distributed to the plurality of modules that are controlled by the IPA based on an arbitrary fixed coefficient. Then, a frequency that can be used by the distributed power consumption is compared with a correspondence table that is registered in advance, and set. Thereby, in the technique disclosed in Non-Patent Document 1, it is possible to reduce dynamic power by lowering frequency and perform heat generation control.

SUMMARY

However, in the technique disclosed in Non-Patent Document 1, the power consumption that can be used can be distributed only at a fixed ratio. When performing heat generation control, there may be a module whose performance degradation is desired to be suppressed depending on load status and use case at that time. However, in the technique disclosed in Non-Patent Document 1, there is a problem that the heat generation control (performance degradation) of a target module has to be performed in accordance with a preset fixed coefficient without considering usage conditions of the module.

Also in the technique disclosed in Japanese Unexamined Patent Application Publication No. 2014-186418, power is supplied to each device to be managed at a fixed ratio, so that there is the same problem as that of the technique disclosed in Non-Patent Document.

The other problems and novel features will become apparent from the description of the present specification and the accompanying drawings.

According to an embodiment, a semiconductor device calculates coefficients of a plurality of modules based on operation rates of the plurality of modules and controls power consumptions of the plurality of modules based on the calculated coefficients of the plurality of modules.

According to the embodiment, it is possible to suppress heating while assigning performances to the plurality of modules whose heat generations are controlled while considering usage conditions of the plurality of modules.

DETAILED DESCRIPTION

The following embodiments will be explained, divided into plural sections or embodiments, if necessary for convenience. Except for the case where it shows clearly in particular, they are not mutually unrelated and one has relationships such as a modified example, an application, details, and a supplementary explanation of some or entire of another. In the following embodiments, when referring to the number of elements, etc. (including the number, a numeric value, an amount, a range, etc.), they may be not restricted to the specific number but may be greater or smaller than the specific number, except for the case where they are clearly specified in particular and where they are clearly restricted to a specific number theoretically.

Further, in the following embodiments, an element (including an operation step etc.) is not necessarily indispensable, except for the case where it is clearly specified in particular and where it is considered to be clearly indispensable from a theoretical point of view, etc.

Overview of Embodiments

Figure 1:
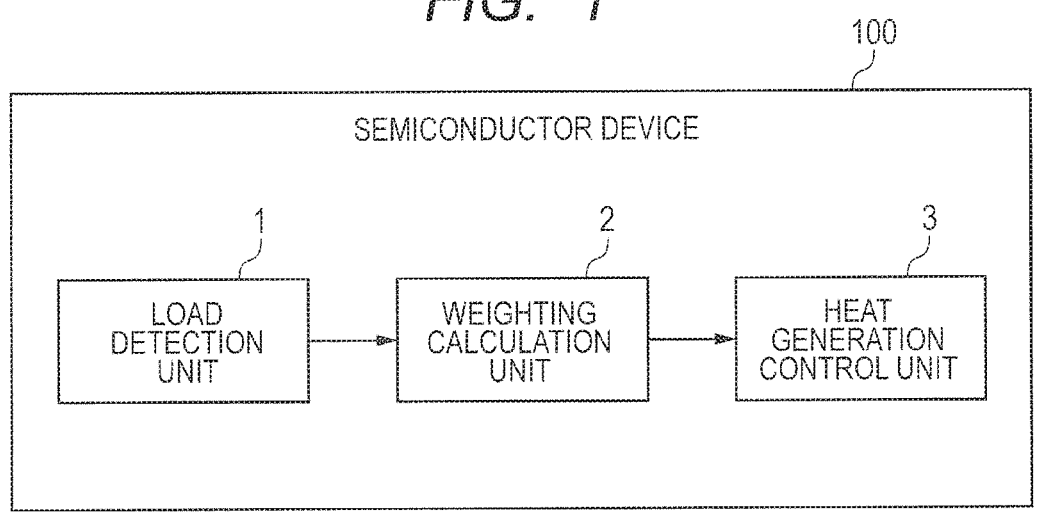
FIG. 1 is a block diagram showing a configuration example of a semiconductor device according to embodiments.

In advance of description of the embodiments, an overview of the embodiments will be described. FIG. 1 is a block diagram showing a configuration example of a semiconductor device 100 according to the embodiments. The semiconductor device 100 is formed on a single semiconductor chip. The semiconductor device 100 includes a load detection unit 1, a weighting calculation unit 2, and a heat generation control unit 3.

The load detection unit 1 detects operation rates of a plurality of modules. The plurality of modules are modules whose heat generations are controlled. The load detection unit 1 outputs the detected operation rates of the plurality of modules to the weighting calculation unit 2.

The weighting calculation unit 2 receives the operation rates of the plurality of modules. Further, the weighting calculation unit 2 calculates coefficients of the plurality of modules based on the operation rates of the plurality of modules. Then, the weighting calculation unit 2 outputs the calculated coefficients of the plurality of modules to the heat generation control unit 3.

The heat generation control unit 3 receives the coefficients of the plurality of modules from the heat generation control unit 3. Then, the heat generation control unit 3 controls power consumption of the plurality of modules based on the coefficients of the plurality of modules.

Figure 2:
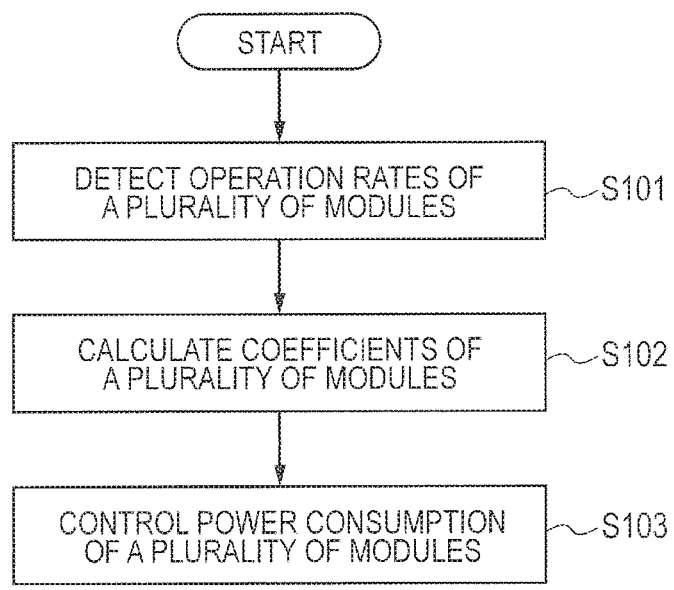
FIG. 2 is a flowchart showing an operation example of the semiconductor device according to the embodiments.

Subsequently, an operation example of the semiconductor device 100 according to the embodiments will be described with reference to the flowchart of FIG. 2.

First, the semiconductor device 100 detects the operation rates of the plurality of modules by the load detection unit 1 (step S101).

Next, the semiconductor device 100 calculates the coefficients of the plurality of modules based on the operation rates of the plurality of modules by the weighting calculation unit 2 (step S102).

Next, the semiconductor device 100 controls the power consumption of the plurality of modules based on the coefficients of the plurality of modules by the heat generation control unit 3 (step S103).

As described above, the semiconductor device 100 according to the embodiments calculates the coefficients of the plurality of modules based on the operation rates of the plurality of modules. Further, the semiconductor device 100 controls the power consumption of the plurality of modules based on the calculated coefficients of the plurality of modules. Thereby, in the semiconductor device 100, it is possible to control power consumption of each module while considering usage conditions of the plurality of modules. Specifically, in the semiconductor device 100, it is possible to suppress heating while assigning performances to the plurality of modules whose heat generations are controlled while considering usage conditions of the plurality of modules.

First Embodiment

Figure 3:
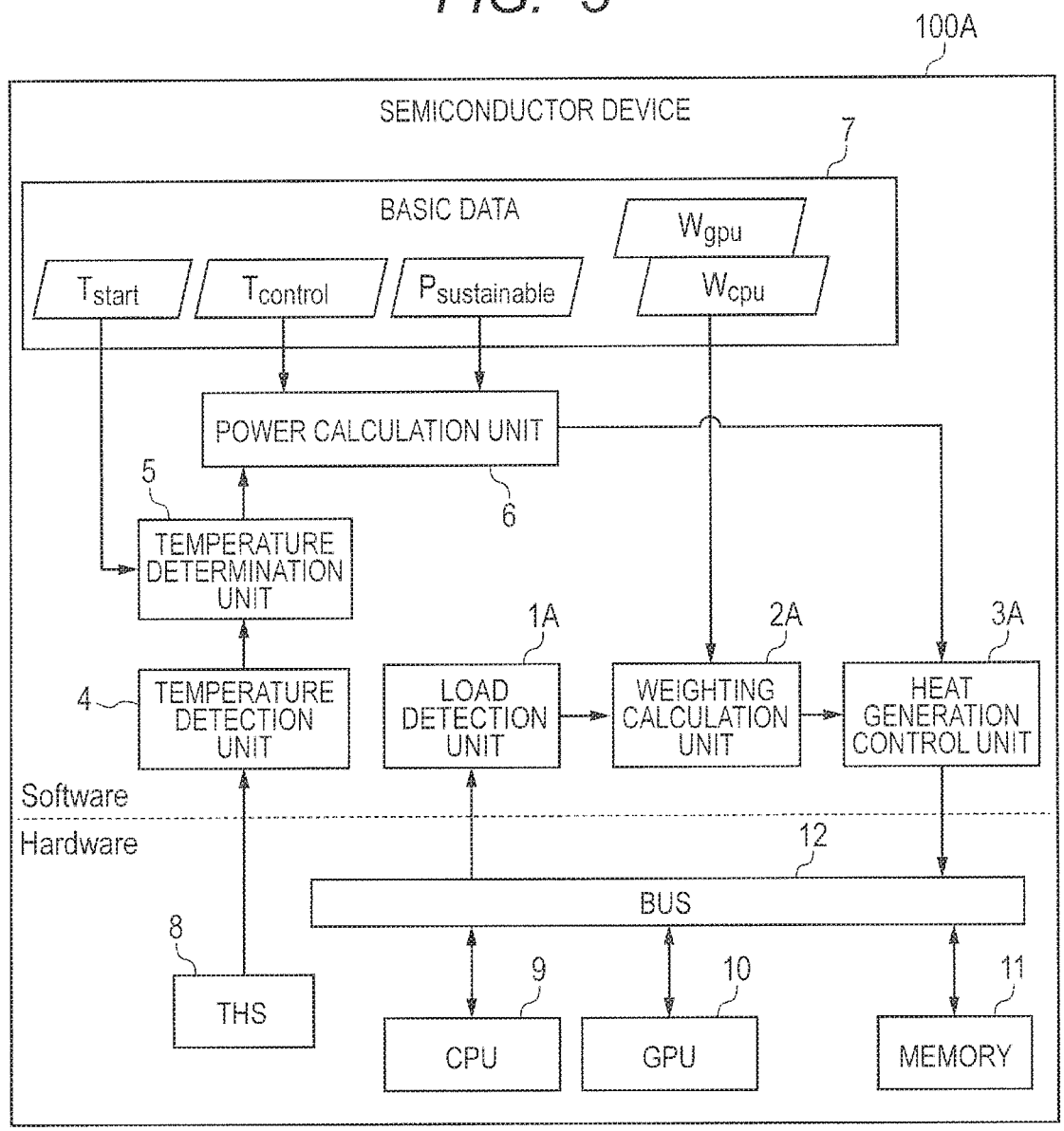
FIG. 3 is a block diagram showing a configuration example of a semiconductor device according to a first embodiment.

Subsequently, the first embodiment will be described. FIG. 3 is a block diagram showing a configuration example of a semiconductor device 100A according to the first embodiment. The semiconductor device 100A includes a THS 8, a CPU (Central Processing Unit) 9, a GPU (Graphics Processing Unit) 10, a memory 11, and a bus 12 as a hardware configuration. The CPU 9, the GPU 10, and the memory 11 are coupled through the bus 12. FIG. 3 shows an example where two modules, which are the CPU 9 and the GPU 10, are used as modules whose heat generations are controlled. However, the number of modules whose heat generations are controlled is not limited to two. The number of modules whose heat generations are controlled may be any number greater than or equal to two. The modules whose heat generations are controlled may be any modules besides the CPU and the GPU.

The semiconductor device 100A further includes a load detection unit 1A, a weighting calculation unit 2A, a heat generation control unit 3A, a temperature detection unit 4, a temperature determination unit 5, a power calculation unit 6, and basic data 7 as a software configuration. Processing in the load detection unit 1A, the weighting calculation unit 2A, the heat generation control unit 3A, the temperature detection unit 4, the temperature determination unit 5, and the power calculation unit 6 is performed when at least one processor executes a program stored in the memory 11. The basic data 7 includes Tstart, Tcontrol, Psustainable, Wcpu, and Wgpu. The basic data 7 is stored, for example, in the memory 11 in advance.

The THS 8 is a thermal sensor for measuring junction temperature Tcurrent(t) on a chip (semiconductor chip) where the semiconductor device 100A is mounted. The temperature detection unit 4 acquires the junction temperature Tcurrent(t) from the THS 8. The temperature detection unit 4 outputs the acquired junction temperature Tcurrent(t) to the temperature determination unit 5.

The temperature determination unit 5 performs start determination of heat generation control by comparing the junction temperature Tcurrent(t) with Tstart in the basic data 7. Specifically, the temperature determination unit 5 determines to start the heat generation control when the junction temperature Tcurrent(t) is higher than or equal to Tstart. Tstart is, for example, 90° C. When the temperature determination unit 5 determines to start the heat generation control, the temperature determination unit 5 outputs the junction temperature Tcurrent(t) to the power calculation unit 6.

The power calculation unit 6 calculates available power P(t) from the current junction temperature Tcurrent(t) on the chip and target junction temperature Tcontrol(t) in the basic data 7. The power calculation unit 6 calculates the available power P(t) by using PID control. Specifically, the power calculation unit 6 calculates total available power P(t) that can be actually used by the CPU 9 and GPU 10 at that time so as to adjust Tcurrent(t) to Tcontrol(t) by using PID control.

Here, a specific example of a calculation method of the available power P(t) will be described. First, the power calculation unit 6 calculates a difference Tdiff(t) by subtracting measured junction temperature Tcurrent(t) from preset target junction temperature Tcontrol(t). Next, the power calculation unit 6 calculates a total amount of available power P(t) by the PID control (Proportional-Integral-Differential Controller) based on Tdiff(t). The PID control is feedback control where an input value is controlled by using a deviation between an output value and a target value and integral and differential elements thereof.

In proportional control corresponding to P of the PID control, it is controlled so that an operation amount is an amount where a difference between a current value and a target value is proportional. When Tdiff(t)<0, a proportional parameter PIDproportional can be represented by the following formula 1.

$$PID\text{proportional} = k\_po \times T\text{diff}(t) \quad \text{(Formula 1)}$$

When Tdiff(t)≥0, the proportional parameter PIDproportional can be represented by the following formula 2.

$$PID\text{proportional} = k\_pu \times T\text{diff}(t) \quad \text{(Formula 2)}$$

In the formulas 1 and 2, k_po and k_pu are proportional gains and can be represented by the following formulas 3 and 4 respectively.

$$k\_po = P\text{sustainable}/(T\text{control} - T\text{start}) \quad \text{(Formula 3)}$$

$$k\_pu = 2 \times P\text{sustainable}/(T\text{control} - T\text{start}) \quad \text{(Formula 4)}$$

Here, Psustainable is the available maximum power which is a total of power consumption that can be consumed by the CPU 9 and the GPU 10 when the junction temperature reaches Tcontrol. Psustainable is a value determined by specification of the chip and is the maximum value of Dynamic power on the specification.

By only the proportional control, control is difficult and a residual error occurs because the operation amount is small when approaching the target value. To eliminate the error, integral control corresponding to I of the PID control performs control so that residual deviation is accumulated and when the residual deviation reaches a certain magnitude, the operation amount is increased and the deviation is eliminated. An integral parameter PIDintegral can be represented by the following formula 5.

$$PID\text{integral} = k\_j \times T\text{diff}(\text{sum}) \quad \text{(Formula 5)}$$

In the formula 5, k_j is an integral gain. The integral gain can be obtained by, for example, numerical simulation or the like. Tdiff(sum) is a total sum of data when Tcurrent(t) exceeds Tcontrol(t). When Tdiff(t)<0, Tdiff(sum) can be represented by the following formula 6.

$$T\text{diff}(\text{sum}) = T\text{diff}(\text{sum}) + T\text{diff}(t) \quad \text{(Formula 6)}$$

Differential control corresponding to D of the PID control quickly responds to variation of external disturbance, so that a corresponding operation amount is controlled from a deviation from the previous time. A differential parameter PIDdifferential can be represented by the following formula 7.

$$PID\text{differential} = k\_d \times \{T\text{diff}(t) - T\text{diff}(t-1)\} \quad \text{(Formula 7)}$$

In the formula 7, k_d is a differential gain. The differential gain can be obtained by, for example, numerical simulation or the like.

The available power P(t) can be obtained from the proportional parameter PIDproportional, the integral parameter PIDintegral, the differential parameter PIDdifferential, and Psustainable, which are described above, as shown by the following formula 8.

$$P(t) = PID\text{proportional} + PID\text{integral} + PID\text{differential} + P\text{sustainable} \quad \text{(Formula 8)}$$

REFERENCE LITERATURE https://github.com/torvalds/linux/tree/master/Documentation/thermal/power_allocator.txt Xin Wang, "Intelligent Power Allocation, Maximize performance in the thermal envelope", WHITE PAPER, ARM In the description of the first embodiment, it is assumed that the available power P(t) is 2000 mW as a result of the calculation performed by the power calculation unit 6. The power calculation unit 6 outputs the available power P(t) to the heat generation control unit 3A.

The load detection unit 1A detects an operation rate of the CPU 9 and an operation rate of the GPU 10. The operation rate of the CPU 9 and the operation rate of the GPU 10 can be acquired in real time by using a scheduler function of an operating system. The load detection unit 1A outputs the detected operation rates of the CPU 9 and the GPU 10 to the weighting calculation unit 2A.

The weighting calculation unit 2A obtains power consumption Ccpu(t) of the CPU 9 by using the operation rate of the CPU 9 which is acquired in real time. Further, the weighting calculation unit 2A obtains power consumption Cgpu(t) of the GPU 10 by using the operation rate of the GPU 10 which is acquired in real time.

Here, a specific example of a calculation method of the power consumption will be described. The power consumption is represented by a sum of dynamic power and leak power as shown by the following formula 9.

$$\text{Power consumption [mW]} = \text{dynamic power [mW]} + \text{leak power [mW]} \quad \text{(Formula 9)}$$

The dynamic power is represented by a product of dynamic element power and effective frequency as shown by the following formula 10. The effective frequency is represented by a product of operation frequency and operation rate as shown by the following formula 11.

$$\text{Dynamic power [mW]} = \text{dynamic element power [mW/MHz]} \times \text{effective frequency [MHz]} \quad \text{(Formula 10)}$$

$$\text{Effective frequency [MHz]} = \text{operation frequency [MHz]} \times \text{operation rate[\%]} \quad \text{(Formula 11)}$$

The dynamic element power is represented by a product of a load capacity and a square of power supply voltage. When the dynamic element power is WE, the load capacity is C, and the power supply voltage is V, the dynamic element power is represented by the following formula 12. The load capacity is acquired in advance as basic data from a design value of the semiconductor device.

$$WE = C \times V^2 \quad \text{(Formula 12)}$$

The leak power is power that is consumed when the power supply is turned on. The leak power is represented by a product of leak current and voltage. When leak current per transistor is iL, a total number of transistors is N, and a shutdown rate is r, the leak power IL is given by the following formula 13. The shutdown rate is a rate where the power supplies are turned off.

$$IL = iL \times N \times (1 - r) \quad \text{(Formula 13)}$$

The leak current per transistor iL can be represented by the following formula 14 by using a coefficient $\alpha$ [A/nm], a gate width W [nm], a threshold voltage VT [V], a sub-threshold coefficient n, a Boltzmann constant k=1.38×10$^{-23}$ [J/K], an absolute temperature T [K], an elementary electric charge q=1.6×10$^{-19}$ [C]. Here, the coefficient $\alpha$ and the sub-threshold coefficient n can be obtained from, for example, an experiment or the like.

$$iL = \alpha \times W \times \exp\{-VT \times q/(n \times kT)\} \quad \text{(Formula 14)}$$

Based on the calculations described above, prerequisite data in the first embodiment is described below as an example. The prerequisite data is recorded in, for example, the memory 11. Tj represents junction temperature.

CPU 9:
Operation frequency: 500 MHz to 1700 MHz
Dynamic element power: 0.46 mW/MHz
Leak power: 150 mW@Tj90° C.
GPU 10:
Operation frequency: 200 MHz to 600 MHz
Dynamic element power: 0.50 mW/MHz
Leak power: 1090 mW@Tj90° C.

In the first embodiment, the weighting calculation unit 2A calculates the power consumption Ccpu(t) of the CPU 9 and the power consumption Cgpu(t) of the GPU 10 as described below by using the various calculations and prerequisite described above. The power consumption Ccpu(t) is real time power consumption according to a CPU operation rate when power control of the CPU 9 is started, and the power consumption Cgpu(t) is real time power consumption according to a GPU operation rate when power control of the GPU 10 is started.

Power consumption Ccpu(t) of CPU 9=853.8 mW (Tj90° C., 90%@1700 MHz)

Power consumption Cgpu(t) of GPU 10=1300 mW (Tj90° C., 70%@600 MHz)

The weighting calculation unit 2A calculates coefficients for calculating power consumption which are distributed to the CPU 9 and the GPU 10 and available respectively in the CPU 9 and the GPU 10 from the power consumption Ccpu(t) of the CPU 9, the power consumption Cgpu(t) of the GPU 10, and available power consumption. FIG. 3 shows an example where a variable Wcpu of a coefficient of the CPU 9 and a variable Wgpu of a coefficient of the GPU 10 are prepared as the basic data 7. In this case, the weighting calculation unit 2A substitutes the calculated coefficients in the variable Wcpu and the variable Wgpu, respectively, and uses the variable Wcpu and the variable Wgpu as a coefficient of the CPU 9 and a coefficient of the GPU 10. The variable Wcpu and the variable Wgpu need not necessarily be prepared as the basic data 7. In this case, the weighting calculation unit 2A does not substitute the calculated coefficients in the variable Wcpu and the variable Wgpu, and uses the calculated coefficients without change as the coefficient of the CPU 9 and the coefficient of the GPU 10.

The coefficient of the CPU 9 is calculated as in the formula 15 described below. The coefficient of the GPU 10 is calculated as in the formula 16 described below.

$$\text{Coefficient of CPU 9}=C\text{cpu}(t)/\{C\text{cpu}(t)+C\text{gpu}(t)\} \quad \text{(Formula 15)}$$

$$\text{Coefficient of GPU 10}=C\text{gpu}(t)/\{C\text{cpu}(t)+C\text{gpu}(t)\} \quad \text{(Formula 16)}$$

Specifically, the coefficient of the CPU 9 is calculated by 853.8/(853.8+1300) to be 39.6%. The coefficient of the GPU 10 is calculated by 1300/(853.8+1300) to be 60.4%.

The weighting calculation unit 2A outputs the coefficient of the CPU 9 and the coefficient of the GPU 10 to the heat generation control unit 3A.

Figure 4:
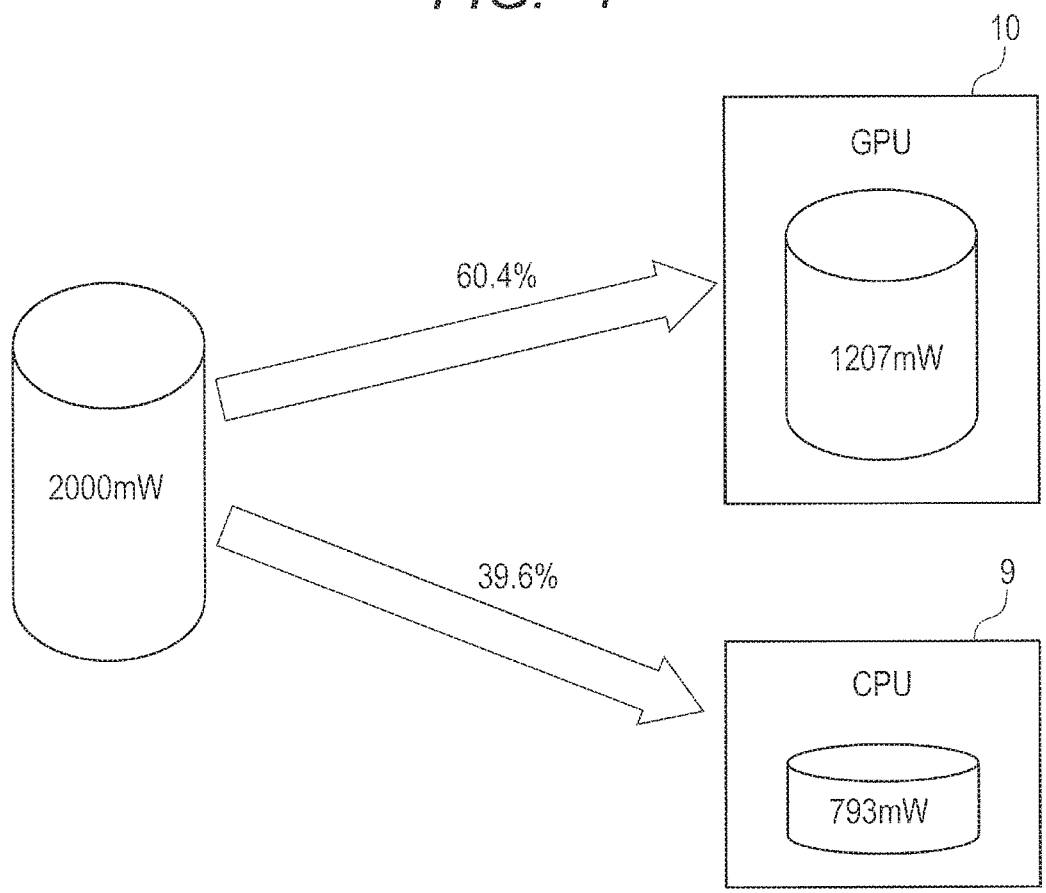
FIG. 4 is a diagram showing a distribution example of power consumption available in the semiconductor device according to the first embodiment.

The heat generation control unit 3A receives the available power P(t) from the power calculation unit 6. Further, the heat generation control unit 3A receives the coefficient of the CPU 9 and the coefficient of the GPU 10 from the weighting calculation unit 2A. Further, the heat generation control unit 3A calculates available power consumption Pcpu(t) distributed to the CPU 9 and available power consumption Pgpu(t) distributed to the GPU 10 by using the available power P(t), the coefficient of the CPU 9, and the coefficient of the GPU 10. According to the prerequisite of the first embodiment and the various calculations described above, the available power P(t) is 2000 mW, the coefficient of the CPU 9 is 39.6%, and the coefficient of the GPU 10 is 60.4%. Therefore, the heat generation control unit 3A determines that the power consumption Pcpu(t) that can be used by the CPU 9 is 793 mW by a calculation of 2000×39.6/100. Further, the heat generation control unit 3A determines that the power consumption Pgpu(t) that can be used by the GPU 10 is 1207 mW by a calculation of 2000×60.4/100. That is, as shown in FIG. 4, the heat generation control unit 3A divides the available power P(t): 2000 mW into the power consumption Pcpu(t) that can be used by the CPU 9: 793 mW and the power consumption Pgpu(t) that can be used by the GPU 10: 1207 mW.

Then, the heat generation control unit 3A controls the power consumption of the CPU 9 and the power consumption of the GPU 10, respectively, so that the divided power consumption Pcpu(t) and Pgpu(t) that can be used by the CPU 9 and the GPU 10, respectively, are satisfied. The heat generation control unit 3A controls the power consumption of the CPU 9 and the GPU 10 by using, for example, at least one of the following: clock control, voltage control, and power supply shutdown. As described above, the present invention can perform power control according to both operation rates of the CPU 9 and the GPU 10 when the power control is started.

Figure 5:
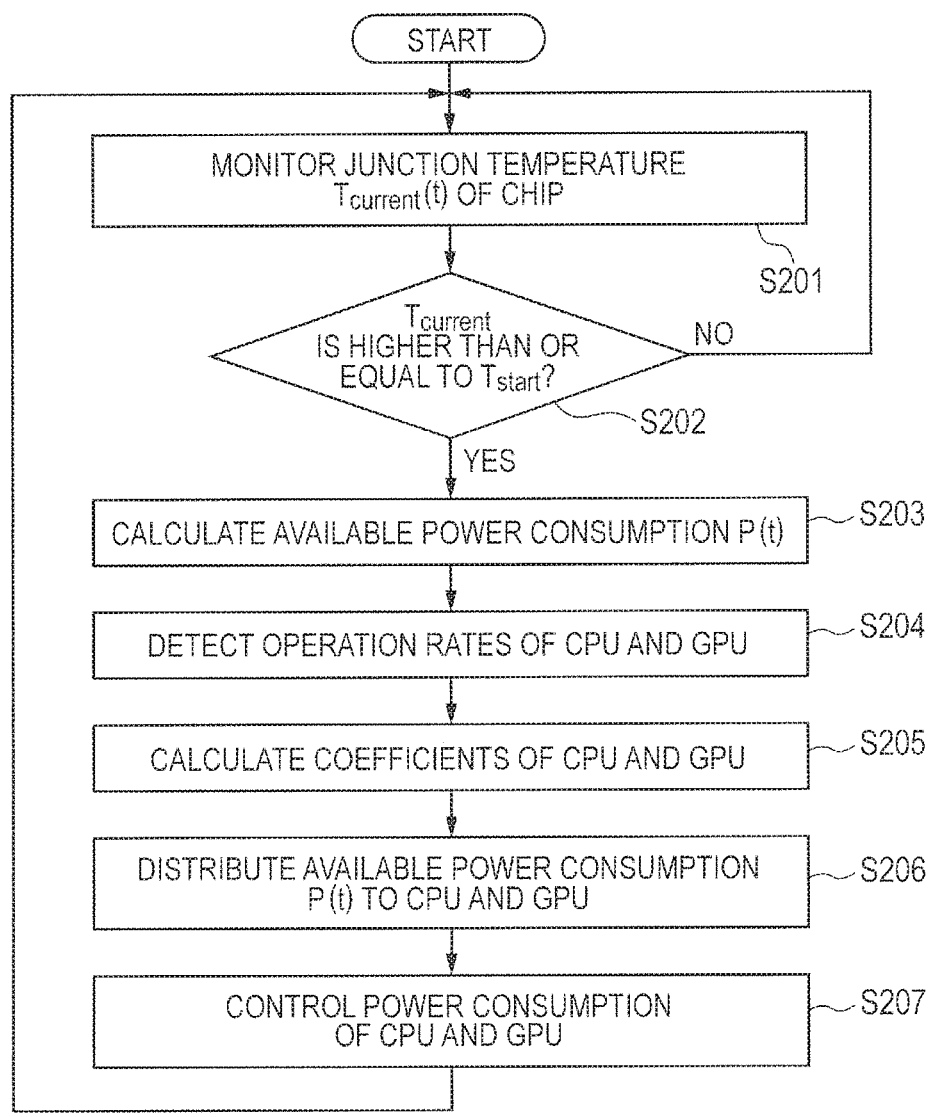
FIG. 5 is a flowchart showing an operation example of the semiconductor device according to the first embodiment.

Subsequently, an operation example of the semiconductor device 100A according to the first embodiment will be described with reference to a flowchart of FIG. 5.

First, the semiconductor device 100A monitors junction temperature Tcurrent(t) of a chip by using the temperature detection unit 4 (step S201).

Next, the semiconductor device 100A determines whether the junction temperature Tcurrent(t) of the chip is higher than or equal to Tstart by using the temperature determination unit 5 (step S202).

When the junction temperature Tcurrent(t) is lower than Tstart (NO in step S202), the semiconductor device 100A continues temperature monitoring in step S201. On the other hand, when the junction temperature Tcurrent(t) is higher than or equal to Tstart (YES in step S202), the semiconductor device 100A calculates the available power P(t) by using the power calculation unit 6 (step S203).

Next, the semiconductor device 100A detects the operation rates of the CPU 9 and the GPU 10 by using the load detection unit 1A (step S204). The aforementioned operation rates of the CPU 9 and the GPU 10 when the power control is started are the operation rates at the time point of step S204.

Next, the semiconductor device 100A calculates the coefficients of the CPU 9 and the GPU 10 based on the operation rates of the CPU 9 and the GPU 10 by using the weighting calculation unit 2A (step S205).

Next, the semiconductor device 100A distributes the available power P(t) to the CPU 9 and the GPU 10 based on the coefficients of the CPU 9 and the GPU 10 by using the heat generation control unit 3A (step S206).

Next, the semiconductor device 100A controls the power consumption of the CPU 9 and the GPU 10 based on the distributed available power consumption (step S207) and returns to the temperature monitoring in step S201.

As described above, the semiconductor device 100A according to the first embodiment includes the power calculation unit 6 that calculates the available power P(t) from the junction temperature Tcurrent(t) on the chip and the target junction temperature Tcontrol(t). Further, the semiconductor device 100A has a configuration where the power calculation unit 6 calculates the available power P(t) by using the PID control. Thereby, in the semiconductor device 100A, it is possible to appropriately obtain the available power P(t) for adjusting the junction temperature Tcurrent(t) on the chip to the target junction temperature Tcontrol(t).

Further, the semiconductor device 100A calculates the power consumption Ccpu(t) of the CPU 9 and the power consumption Cgpu(t) of the GPU 10 based on the respective operation rates of the CPU 9 and the GPU 10 by using the weighting calculation unit 2A. Further, the semiconductor device 100A calculates ratios of the power consumption Ccpu(t) of the CPU 9 and the power consumption Cgpu(t) of the GPU 10 to the power consumption of the sum of Ccpu(t) and Cgpu(t) as respective coefficients of the CPU 9 and the GPU 10. Thereby, in the semiconductor device 100A, it is possible to dynamically calculate a coefficient based on an operation rate of each module.

Further, the semiconductor device 100A has a configuration in which the heat generation control unit 3A distributes the available power P(t) to the CPU 9 and the GPU 10 based on the coefficients of the CPU 9 and the GPU 10. Further, the semiconductor device 100A controls power consumption of the CPU 9 and the GPU 10 based on an available power consumption value distributed by the heat generation control unit 3A. Thereby, in the semiconductor device 100A, it is possible to distribute the available power P(t) to the CPU 9 and the GPU 10 by using coefficients based on respective operation rates of the CPU 9 and the GPU 10. Therefore, in the semiconductor device 100A, it is possible to perform heat generation control considering a use case and a load status, so that it is possible to improve user experience of a product.

Second Embodiment

Figure 6:
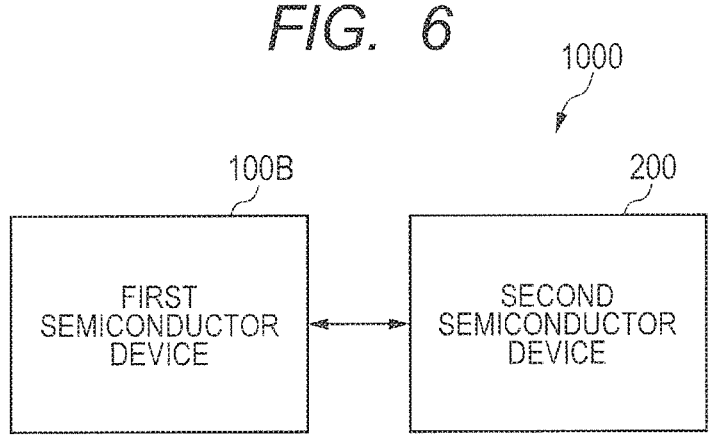
FIG. 6 is a block diagram showing a configuration example of a semiconductor system according to a second embodiment.

Subsequently, the second embodiment will be described. FIG. 6 is a block diagram showing a configuration example of a semiconductor system 1000 according to the second embodiment. The semiconductor system 1000 includes a first semiconductor device 100B and a second semiconductor device 200. The first semiconductor device 100B and the second semiconductor device 200 are formed on different semiconductor chips respectively.

In the second embodiment, an example where the semiconductor system 1000 includes two semiconductor devices, which are the first semiconductor device 100B and the second semiconductor device 200, will be described. However, the number of semiconductor devices included in the semiconductor system 1000 is not limited to two. The number of semiconductor devices included in the semiconductor system 1000 may be any number greater than or equal to two. When the number of semiconductor devices included in the semiconductor system 1000 is three or more, the semiconductor devices other than the first semiconductor device 100B have the same configuration as that of the second semiconductor device 200.

The second semiconductor device 200 has the same temperature characteristics as those of the first semiconductor device 100B. The second semiconductor device 200 may have any configuration as long as the second semiconductor device 200 has the same temperature characteristics as those of the first semiconductor device 100B. In the description below, it is assumed that the second semiconductor device 200 includes a CPU 21 and a GPU 22 as a hardware configuration.

Figure 7:
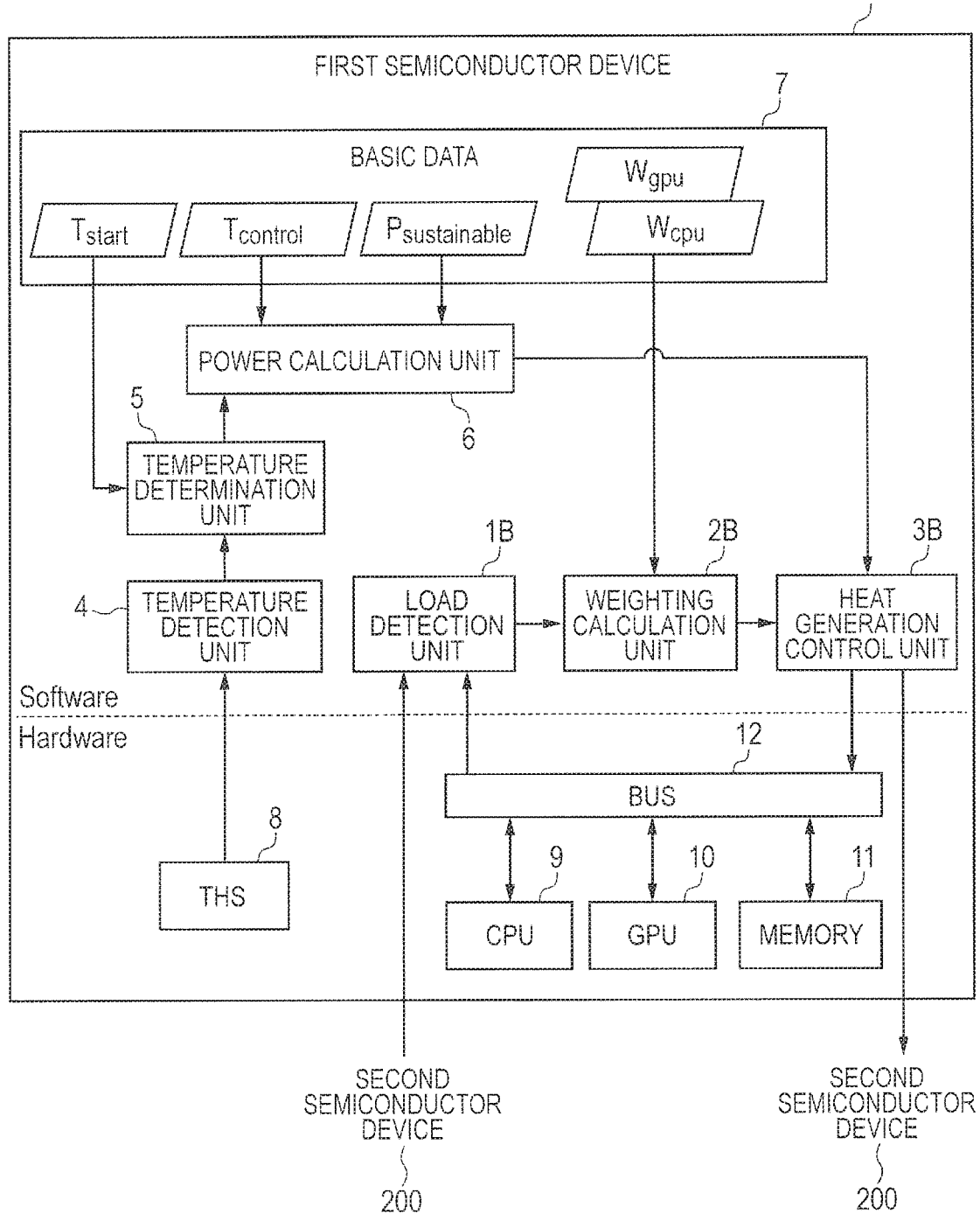
FIG. 7 is a block diagram showing a configuration example of a first semiconductor device according to the second embodiment.

Subsequently, the first semiconductor device 100B according to the second embodiment will be described with reference to a block diagram in FIG. 7. The first semiconductor device 100B includes a THS 8, a CPU 9, a GPU 10, a memory 11, and a bus 12 as a hardware configuration. The first semiconductor device 100B further includes a load detection unit 1B, a weighting calculation unit 2B, a heat generation control unit 3B, a temperature detection unit 4, a temperature determination unit 5, a power calculation unit 6, and basic data 7 as a software configuration. In the first semiconductor device 100B, a configuration other than the load detection unit 1B, the weighting calculation unit 2B, and the heat generation control unit 3B is the same as that of the semiconductor device 100A of the first embodiment, so that the description of the configuration will be omitted.

The load detection unit 1B detects an operation rate of the CPU 9, an operation rate of the GPU 10, an operation rate of the CPU 21, and an operation rate of the GPU 22. The load detection unit 1B acquires the operation rate of the CPU 21 and the operation rate of the GPU 22 from the second semiconductor device 200 through wiring between the first semiconductor device 100B and the second semiconductor device 200. The load detection unit 1B outputs the operation rate of the CPU 9, the operation rate of the GPU 10, the operation rate of the CPU 21, and the operation rate of the GPU 22 to the weighting calculation unit 2B.

The weighting calculation unit 2B obtains power consumption Ccpu9($t$) of the CPU 9, power consumption Cgpu10($t$) of the GPU 10, power consumption Ccpu21($t$) of the CPU 21, and power consumption Cgpu22($t$) of the GPU 22 based on respectively the operation rate of the CPU 9, the operation rate of the GPU 10, the operation rate of the CPU 21, and the operation rate of the GPU 22. Further, the weighting calculation unit 2B calculates coefficients for calculating power consumption that can be used in the CPU 9, the GPU 10, the CPU 21, and the GPU 22 based on the power consumption Ccpu9($t$) of the CPU 9, the power consumption Cgpu10($t$) of the GPU 10, the power consumption Ccpu21($t$) of the CPU 21, and the power consumption Cgpu22($t$) of the GPU 22.

Specifically, the weighting calculation unit 2B calculates ratios of the power consumption Ccpu9($t$) of the CPU 9, the power consumption Cgpu10($t$) of the GPU 10, the power consumption Ccpu21($t$) of the CPU 21, and the power consumption Cgpu22($t$) of the GPU 22 to the power consumption of the sum of Ccpu9($t$), Cgpu10($t$), Ccpu21($t$), and Cgpu22($t$) as respective coefficients of the CPU 9, the GPU 10, the CPU 21, and the GPU 22. Then, the weighting calculation unit 2B outputs the coefficients of the CPU 9, the GPU 10, the CPU 21, and the GPU 22 to the heat generation control unit 3B.

The heat generation control unit 3B receives the coefficients of the CPU 9, the GPU 10, the CPU 21, and the GPU 22 from the weighting calculation unit 2B. Further, the heat generation control unit 3B receives the available power P(t) from the power calculation unit 6. The available power P(t) in the second embodiment indicates a total power that can be used by the first semiconductor device 100B and the second semiconductor device 200. The available power consumption is calculated by using the junction temperature Tcurrent (t) obtained by the thermal sensor THS 8 on the chip of the first semiconductor device 100B.

The heat generation control unit 3B calculates power consumption Pcpu9($t$) that can be used by the CPU 9, power consumption Pgpu10($t$) that can be used by the GPU 10, power consumption Pcpu21($t$) that can be used by the CPU 21, and power consumption Pgpu22($t$) that can be used by the GPU 22 by using the available power P(t) and the coefficients of the CPU 9, the GPU 10, the CPU 21, and the GPU 22. That is, the heat generation control unit 3B divides the available power P(t) into Pcpu9($t$), Pgpu10($t$), Pcpu21($t$), and Pgpu22($t$).

Then, the heat generation control unit 3B controls the power consumption of the CPU 9, the GPU 10, the CPU 21, and the GPU 22 so that the divided Pcpu9(t), Pgpu10(t), Pcpu21(t), and Pgpu22(t) are satisfied. The heat generation control unit 3B controls the power consumption of the CPU 9, the GPU 10, the CPU 21, and the GPU 22 by using, for example, at least one of the following: clock control, voltage control, and power supply shutdown. The heat generation control unit 3B controls the power consumption of the CPU 21 and the GPU 22 through the wiring between the first semiconductor device 100B and the second semiconductor device 200.

In the second embodiment, a configuration is described where the first semiconductor device 100B includes the CPU 9 and the GPU 10 as the modules whose heat generations are controlled and the second semiconductor device 200 includes the CPU 21 and the GPU 22 as the modules whose heat generations are controlled. However, the configuration is not limited to the above. For example, a configuration may be employed where the first semiconductor device 100B includes a first module as the module whose heat generation is controlled and the second semiconductor device 200 includes a second module as the module whose heat generation is controlled.

As described above, the semiconductor system 1000 according to the second embodiment includes the first semiconductor device 100B and the second semiconductor device 200. The first semiconductor device 100B includes the load detection unit 1B, the weighting calculation unit 2B, and the heat generation control unit 3B. The load detection unit 1B detects an operation rate of the first module of the first semiconductor device 100B and an operation rate of the second module of the second semiconductor device 200. The weighting calculation unit 2B calculates coefficients of the first module and the second module based on the operation rates of the first module and the second module. Further, the heat generation control unit 3B controls power consumption of the first module and the second module based on the coefficients of the first module and the second module. Thereby, in the semiconductor system 1000, it is possible to control power consumption of each module while considering usage condition of each module in a plurality of semiconductor devices. Specifically, in the semiconductor system 1000, it is possible to suppress heating while assigning performance to each module in a plurality of semiconductor devices whose heat generations are controlled while considering usage conditions of each module.

Third Embodiment

Subsequently, the third embodiment will be described. A semiconductor system 1000C according to the third embodiment is a modified example of the semiconductor system 1000 of the second embodiment. The semiconductor system 1000C includes a first semiconductor device 100C and a second semiconductor device 200C. The first semiconductor device 100C and the second semiconductor device 200C are formed on different semiconductor chips respectively. A configuration of the semiconductor system 1000C is the same as that of the semiconductor system 1000 of the second embodiment, so that the drawing of the configuration of the semiconductor system 1000C is omitted.

The second semiconductor device 200C has temperature characteristics different from those of the first semiconductor device 100C. The second semiconductor device 200C includes a THS in addition to the CPU 21 and the GPU 22 as a hardware configuration.

Figure 8:
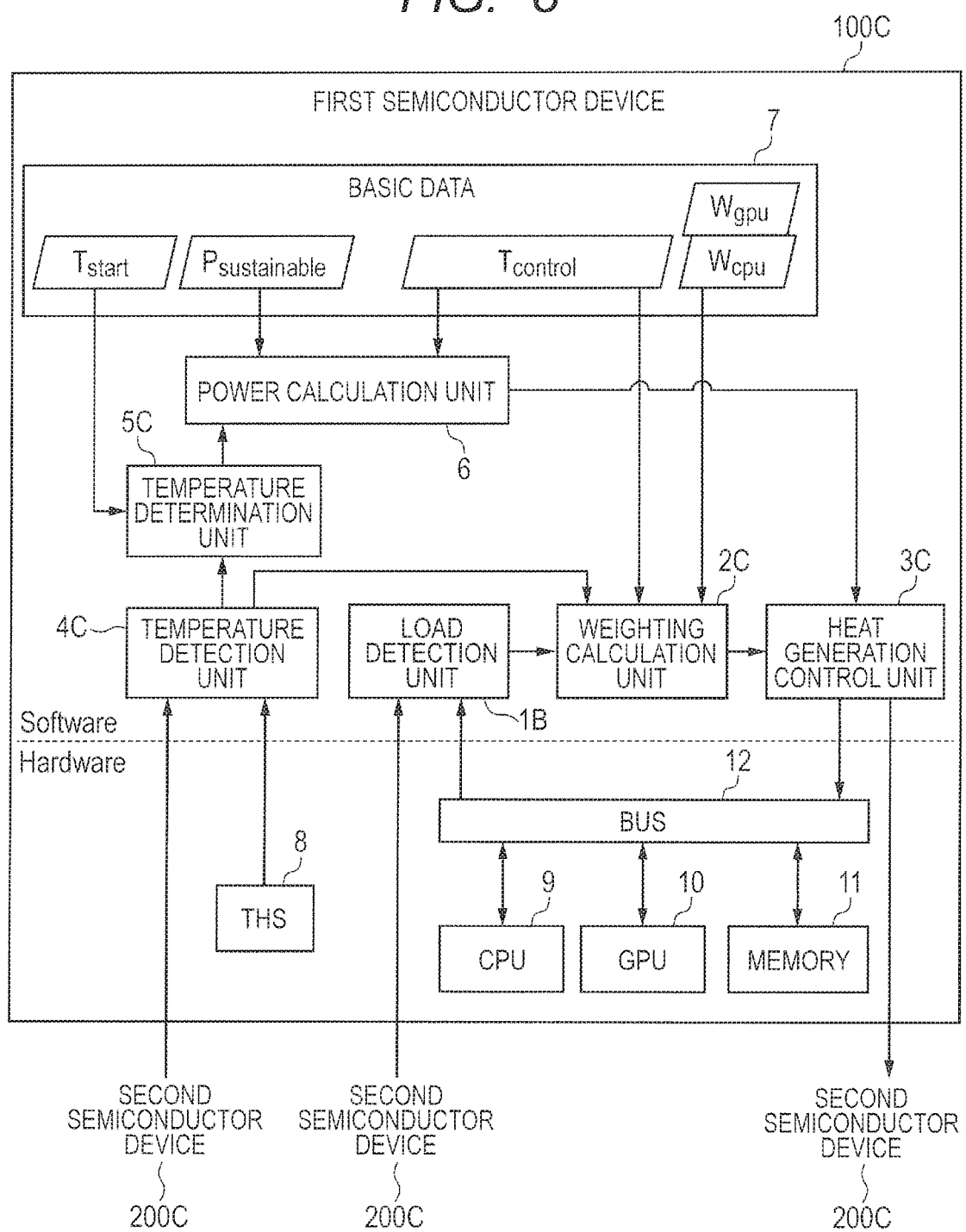
FIG. 8 is a block diagram showing a configuration example of a first semiconductor device according to a third embodiment.

Subsequently, a configuration example of the first semiconductor device 100C according to the third embodiment will be described with reference to a block diagram in FIG. 8. The first semiconductor device 100C includes a THS 8, a CPU 9, a GPU 10, a memory 11, and a bus 12 as a hardware configuration. The first semiconductor device 100C further includes a load detection unit 1B, a weighting calculation unit 2C, a heat generation control unit 3C, a temperature detection unit 4C, a temperature determination unit 5C, a power calculation unit 6, and basic data 7 as a software configuration.

The temperature detection unit 4C acquires first Tcurrent(t) which is junction temperature on a chip of the first semiconductor device 100C from the THS 8. Further, the temperature detection unit 4C acquires second Tcurrent(t) which is junction temperature on a chip of the second semiconductor device 200C from the THS 23 of the second semiconductor device 200C. Then, the temperature detection unit 4C outputs the acquired first Tcurrent(t) and second Tcurrent(t) to the temperature determination unit 5C. Further, the temperature detection unit 4C outputs the acquired first Tcurrent(t) and second Tcurrent(t) to the weighting calculation unit 2C.

The temperature determination unit 5C performs start determination of heat generation control by comparing the first Tcurrent(t) and the second Tcurrent(t) with Tstart. For example, the temperature determination unit 5C determines to start the heat generation control when at least one of the first Tcurrent(t) and the second Tcurrent(t) is higher than or equal to Tstart.

The weighting calculation unit 2C obtains power consumption Ccpu9(t) of the CPU 9, power consumption Cgpu10(t) of the GPU 10, power consumption Ccpu21(t) of the CPU 21, and power consumption Cgpu22(t) of the GPU 22 based on respectively the operation rate of the CPU 9, the operation rate of the GPU 10, the operation rate of the CPU 21, and the operation rate of the GPU 22. Further, the weighting calculation unit 2C calculates coefficients for calculating power consumption that can be used in the CPU 9, the GPU 10, the CPU 21, and the GPU 22 based on the power consumption Ccpu9(t) of the CPU 9, the power consumption Cgpu10(t) of the GPU 10, the power consumption Ccpu21(t) of the CPU 21, and the power consumption Cgpu22(t) of the GPU 22.

Specifically, the weighting calculation unit 2C calculates ratios of the power consumption Ccpu9(t) of the CPU 9 and the power consumption Cgpu10(t) of the GPU 10 to the power consumption of the sum of Ccpu9(t) and Cgpu10(t) as respective coefficients of the CPU 9 and the GPU 10. Further, the weighting calculation unit 2C calculates ratios of the power consumption Ccpu21(t) of the CPU 21 and the power consumption Cgpu22(t) of the GPU 22 to the power consumption of the sum of Ccpu21(t) and Cgpu22(t) as respective coefficients of the CPU 21 and the GPU 22.

Further, the weighting calculation unit 2C calculates temperature coefficients of the first semiconductor device 100C and the second semiconductor device 200C based on first Tdiff(t) obtained by subtracting the first Tcurrent(t) from the target junction temperature Tcontrol(t) and second Tdiff(t) obtained by subtracting the second Tcurrent(t) from the target junction temperature Tcontrol(t).

Specifically, the weighting calculation unit 2C calculates ratios of the first Tdiff(t) and the second Tdiff(t) to the sum of the first Tdiff(t) and the second Tdiff(t) as the temperature coefficients of the first semiconductor device 100C and the second semiconductor device 200C, respectively. Specifically, the temperature coefficient of the first semiconductor device 100C is calculated as in the formula 17 described below. The temperature coefficient of the second semiconductor device 200C is calculated as in the formula 18 described below.

The temperature coefficient of the first semiconductor device 100C=first $T\text{diff}(t)/\{\text{first } T\text{diff}(t)+\text{second } T\text{diff}(t)\}$ (Formula 17)

The temperature coefficient of the second semiconductor device 200C=second $T\text{diff}(t)/\{\text{first } T\text{diff}(t)+\text{second } T\text{diff}(t)\}$ (Formula 18)

As an example, a case where the target junction temperature Tcontrol(t) is 100° C., the first Tcurrent(t) is 90° C., and the second Tcurrent(t) is 50° C. will be described. The temperature coefficient of the first semiconductor device 100C is calculated by 10/(10+50) to be 16.7%. The temperature coefficient of the second semiconductor device 200C is calculated by 50/(10+50) to be 83.3%.

The weighting calculation unit 2C outputs the coefficients of the CPU 9, the GPU 10, the CPU 21, and the GPU 22, the temperature coefficient of the first semiconductor device 100C, and the temperature coefficient of the second semiconductor device 200C to the heat generation control unit 3C.

The heat generation control unit 3C calculates the power consumption Pcpu9(t) that can be used by the CPU 9, the power consumption Pgpu10(t) that can be used by the GPU 10, the power consumption Pcpu21(t) that can be used by the CPU 21, and the power consumption Pgpu22(t) that can be used by the GPU 22 by using the available power P(t), the coefficients of the CPU 9, the GPU 10, the CPU 21, and the GPU 22, the temperature coefficient of the first semiconductor device 100C, and the temperature coefficient of the second semiconductor device 200C. The available power P(t) in the third embodiment indicates a total power that can be used by the first semiconductor device 100C and the second semiconductor device 200C.

Specifically, the heat generation control unit 3C calculates the power consumption Pcpu9(t) that can be used by the CPU 9, the power consumption Pgpu10(t) that can be used by the GPU 10, the power consumption Pcpu21(t) that can be used by the CPU 21, and the power consumption Pgpu22(t) that can be used by the GPU 22 by using the following formulas 19 to 22, respectively.

$P\text{cpu}9(t)=P(t)\times$coefficient of CPU 9$\times$temperature coefficient of first semiconductor device 100C (Formula 19)

$P\text{gpu}10(t)=P(t)\times$coefficient of GPU 10$\times$temperature coefficient of first semiconductor device 100C (Formula 20)

$P\text{cpu}21(t)=P(t)\times$coefficient of CPU 21$\times$temperature coefficient of second semiconductor device 200C (Formula 21)

$P\text{gpu}22(t)=P(t)\times$coefficient of GPU 22$\times$temperature coefficient of second semiconductor device 200C (Formula 22)

Here, an example of calculations performed by the heat generation control unit 3C based on the following prerequisite will be described.

Available power P(t): 2000 mW
Coefficient of CPU 9: 39.6%
Coefficient of GPU 10: 60.4%
Coefficient of CPU 21: 50.8%
Coefficient of GPU 22: 49.2%
Temperature coefficient of first semiconductor device 100C: 16.7%

Temperature coefficient of second semiconductor device 200C: 83.3%

In this case, the power consumption Pcpu9(t) that can be used by the CPU 9 is calculated by 2000×39.6/100×16.7/100 to be 132.3 mW. The power consumption Pgpu10(t) that can be used by the GPU 10 is calculated by 2000×60.4/100×16.7/100 to be 201.7 mW. The power consumption Pcpu21(t) that can be used by the CPU 21 is calculated by 2000×50.8/100×83.3/100 to be 846.3 mW. The power consumption Pgpu22(t) that can be used by the GPU 22 is calculated by 2000×49.2/100×83.3/100 to be 819.7 mW.

Then, the heat generation control unit 3C controls the power consumption of the CPU 9, the GPU 10, the CPU 21, and the GPU 22 so that the calculated Pcpu9(t), Pgpu10(t), Pcpu21(t), and Pgpu22(t) are satisfied.

As described above, the semiconductor system 1000C according to the third embodiment includes the first semiconductor device 100C and the second semiconductor device 200C. The first semiconductor device 100C includes the load detection unit 1B, the weighting calculation unit 2C, the heat generation control unit 3C, and the temperature detection unit 4C. The temperature detection unit 4C detects the first Tcurrent(t) which is the junction temperature on the chip of the first semiconductor device 100C and the second Tcurrent(t) which is the junction temperature on the chip of the second semiconductor device 200C. The weighting calculation unit 2C calculates the temperature coefficients of the first semiconductor device 100C and the second semiconductor device 200C based on the first Tdiff(t) obtained by subtracting the first Tcurrent(t) from the target junction temperature Tcontrol(t) and the second Tdiff(t) obtained by subtracting the second Tcurrent(t) from the Tcontrol(t). Further, the heat generation control unit 3C controls power consumption of a module of the first semiconductor device 100C and a module of the second semiconductor device 200C based on a coefficient of the module of the first semiconductor device 100C, a coefficient of the module of the second semiconductor device 200C, the temperature coefficient of the first semiconductor device 100C, and the temperature coefficient of the second semiconductor device 200C. Thereby, in the semiconductor system 1000C, it is possible to control power consumption of each module while considering temperature conditions of the first semiconductor device 100C and the second semiconductor device 200C in addition to usage condition of each module. In other words, in the semiconductor system 1000C, it is possible to suppress heating while assigning performance to each module in a plurality of semiconductor devices whose heat generations are controlled while considering usage condition and temperature condition of each module.

While the invention made by the inventors has been specifically described based on the embodiments, it is needless to say that the invention is not limited to the embodiments that have been described, but can be variously changed without departing from the scope of the invention.

What is claimed is:
1. A semiconductor device comprising:
a load detection unit that detects a first operation rate of a first module and a second operation rate for a second module;
a weighting calculation unit that:
calculates 1) first power consumption for the first module based on the first operation rate of the first module and 2) second power consumption for the second module based on the second operation rate of the second module; and calculates 1) a first ratio of i) the calculated first power consumption for the first module to ii) a sum of the first and second power consumptions as a first coefficient of the first module, and 2) a second ratio of i) the calculated second power consumption for the second module to ii) the sum of the first and second power consumptions as a second coefficient of the second module; and a heat generation control unit that controls power consumption for the first module and the second module based on the first coefficient and the second coefficient, respectively.

2. The semiconductor device according to claim 1, further comprising:

a power calculation unit that calculates available power P(t) for the first module and the second module based on (1) junction temperature Tcurrent(t) on a chip on which the semiconductor device is mounted, and (2) target junction temperature Tcontrol(t), wherein the power calculation unit calculates the available power P(t) by using PID control, and wherein the heat generation control unit distributes the available power P(t) to the first module based on the first coefficient and the second module based on the second coefficient.

3. The semiconductor device according to claim 1, wherein the first operation rate of the first module and the second operation rate of the second module are acquired in real time by using a scheduler function of an operating system.

4. A semiconductor system comprising:
a first semiconductor device; and
a second semiconductor device,
wherein the first semiconductor device includes
    a load detection unit that detects a first operation rate of a first module of the first semiconductor device and a second operation rate of a second module of the second semiconductor device,
    a weighting calculation unit that:
        calculates 1) first power consumption of the first module based on the first operation rate of the first module and 2) second power consumption of the second module based on the second operation the second module; and
        calculates 1) a first ratio of the calculated first power consumption of the first module to a sum of the first and second power consumptions as a first coefficient of the first module, and 2) a second ratio of the calculated second power consumption of the second module to the sum of the first and second power consumptions as a second coefficient of the second module, and
    a heat generation control unit that controls power consumptions of the first module and the second module based on the first coefficient and the second coefficient, respectively.

5. The semiconductor system according to claim 4, further comprising:

a power calculation unit that calculates available power P(t) for the first module and the second module based on (1) junction temperature Tcurrent(t) on a chip on which the first semiconductor device is mounted and (2) target junction temperature Tcontrol(t), wherein the power calculation unit calculates the available power P(t) by using PID control, and wherein the heat generation control unit that 1) distributes the available power P(t) to the first module based on the first coefficient and the second module based on the second coefficient.

6. The semiconductor system according to claim 5, wherein the first semiconductor device further includes a temperature detection unit that detects first Tcurrent(t) which is junction temperature on the chip of the first semiconductor device and second Tcurrent(t) which is junction temperature on a chip of the second semiconductor device, wherein the weighting calculation unit calculates temperature coefficients of the first semiconductor device and the second semiconductor device based on first Tdiff(t) obtained by subtracting the first Tcurrent(t) from target junction temperature Tcontrol(t) and second Tdiff(t) obtained by subtracting the second Tcurrent(t) from the target junction temperature Tcontrol(t), and wherein the heat generation control unit controls the power consumptions of the first module and the second module based on the first and second coefficients and the temperature coefficients of the first semiconductor device and the second semiconductor device.

7. The semiconductor system according to claim 4, wherein the first operation rate of the first module and the second operation rate of the second module are acquired in real time by using a scheduler function of an operating system.

8. A control method in a semiconductor device, the method comprising:

detecting a first operation rate of a first module and a second operation rate for a second module;

calculating power consumption for the first module based on the first operation rate of the first module and 2) second power consumption for the second module based on the second operation rate of the second module;

calculating 1) a first ratio of the calculated first power consumption for the first module to a sum of the first and second power consumptions as a first coefficient of the first module, and 2) a second ratio of the calculated second power consumption for the second module to the sum of the first and second power consumptions as a second coefficient of the second module; and controlling power consumptions for the first module and the second module based on the first coefficient and the second coefficient, respectively.

9. The control method according to claim 8, further comprising:

calculating available power P(t) for the first module and the second module based on (1) junction temperature Tcurrent(t) on a chip on which the semiconductor device is mounted and (2) target junction temperature Tcontrol(t); and distributing the available power P(t) to the first module based on the first coefficient and the second module based on the second coefficient, wherein the calculating the available power P(t) is calculating the available power P(t) by using PID control.

10. The control method according to claim 8, wherein the first operation rate of the first module and the second operation rate of the second module are acquired in real time by using a scheduler function of an operating system.

* * * * *